United States Patent
Sellers

(10) Patent No.: US 6,812,705 B1
(45) Date of Patent: Nov. 2, 2004

(54) COOLANT COOLED RF BODY COIL

(75) Inventor: Michael Ben Sellers, Florence, SC (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/707,322

(22) Filed: Dec. 5, 2003

(51) Int. Cl.[7] .................................................. G01V 3/00
(52) U.S. Cl. ...................................... 324/318; 324/315
(58) Field of Search ................................ 324/318, 322, 324/315, 314, 300

(56) References Cited

U.S. PATENT DOCUMENTS

| | | |
|---|---|---|
| 5,661,399 A | 8/1997 | Sellers |
| 5,675,255 A | 10/1997 | Sellers et al. |
| 5,698,980 A | 12/1997 | Sellers et al. |
| 5,708,362 A | 1/1998 | Frese et al. |
| 5,786,694 A | 7/1998 | Kilian et al. |
| 6,075,363 A | 6/2000 | Sellers et al. |
| 6,100,693 A * | 8/2000 | Eberler et al. ............... 324/318 |
| 6,107,799 A | 8/2000 | Sellers et al. |
| 6,525,537 B2 * | 2/2003 | Nerreter ...................... 324/322 |
| 6,552,545 B2 * | 4/2003 | Kaindl et al. ................ 324/318 |

* cited by examiner

*Primary Examiner*—Louis Arana
(74) *Attorney, Agent, or Firm*—Michael Della Penna

(57) ABSTRACT

A thermal barrier is introduced to a magnetic resonance imaging system between the patient bore and each of the gradient coil assembly and RF body coil assembly to maintain the temperature within the patient bore below a maximum operating temperature. This allows the RF body coils to run cooler and also provides a thermal barrier between the gradient coils and the patient bore. In one preferred embodiment, a hollow conductor structure is introduced to the RF body coils at a position between the gradient coils and the patient bore tube. In another embodiment, the hollow conductor structure replaces the flat copper strip of the prior art and itself functions as the RF body coils.

32 Claims, 2 Drawing Sheets

COOLANT COOLED RF BODY COIL

BACKGROUND OF INVENTION

The present invention relates generally to magnetic resonance imaging systems and more particularly to a coolant-cooled RF body coil for use in a magnetic resonance imaging system.

Magnetic Resonance Imaging (MRI) is a well-known medical procedure for obtaining detailed, one, two and three-dimensional images of patients, using the methodology of nuclear magnetic resonance (NMR). MRI is well suited to the visualization of soft tissues and is primarily used for diagnosing disease pathologies and internal injuries.

Typical MRI systems include a superconducting magnet capable of producing a strong, homogenous magnetic field around a patient or portion of the patient; a radio frequency (RF) transmitter and receiver system, including transmitter and receiver coils, also surrounding or impinging upon a portion of the patient; a magnetic gradient coil system also surrounding a portion of the patient; and a computer processing/imaging system, receiving the signals from the receiver coil and processing the signals into interpretable data, such as visual images.

The superconducting magnet is used in conjunction with a magnetic gradient coil assembly, which is temporally pulsed to generate a sequence of controlled gradients in the main magnetic field during a MRI data gathering sequence. In as much as the main superconducting magnet produces a homogeneous field, no spatial property varies from location to location within the space bathed by such field; therefore, no spatial information, particularly pertaining to an image, can be extracted there from, except by the introduction of ancillary means for causing spatial (and temporal) variations in the field strength. The above-mentioned gradient coil assembly fulfills this function; and it is by this means of manipulating the gradient fields that spatial information is typically encoded.

The actual image data consist of radio frequency signals, which are stimulated and received by means of systems of resonant radio frequency coils that irradiate the patient in the scanning volume. These coils typically fall into two classes: volume and surface resonators.

A magnetic resonance apparatus has a plurality of gradient coils that are arranged on a (superconductive) magnet, such as the exterior of the cryostat. These gradient coils each generate a magnetic field with a linear gradient, which is essential for generating image signals. Three gradient coils are normally provided, respectively generating linear magnetic field gradients during operation of the magnetic resonance apparatus that are directed perpendicular to one another. The directions of these gradients are usually indicated as the x, y and z-axis of a Cartesian coordinate system.

A diagnostic nuclear magnetic resonance device of the above general type is known from U.S. Pat. No. 4,954,781. The nuclear magnetic resonance device disclosed therein has a cylindrical examination chamber that accepts a patient to be examined. The examination chamber is surrounded by a superconducting magnet that generates a homogeneous main magnetic field in the examination chamber extending in an axial direction, i.e. the z-direction. A cylindrical carrier tube is arranged between the superconducting magnet and the examination chamber, to which gradient coils are attached for the generation of gradient fields in directions perpendicular to one another, of which one direction coincides with the direction of the main magnetic field in the z-direction. High-frequency antennas are likewise fastened to the carrier tube, by means of which nuclear spins in an examination subject are excited and the resulting nuclear magnetic resonance signals are received.

In the operation of the nuclear magnetic resonance apparatus for the generation of sectional images, the gradient fields must be switched on and off. This is achieved by supplying the gradient coils with switched currents of different amplitudes and different switching frequencies, with the direction of the currents through the gradient coils additionally being changed. This has the consequence that the conductors of the gradient coils, as well as the carrier tube, heat up. Furthermore, the conductors are exposed to oscillating forces that produce bothersome noises. In modern imaging sequences, particularly during rapid imaging, the gradient coils can reach high temperatures and can emit high acoustic noise levels.

SUMMARY OF INVENTION

The present invention addresses these concerns by providing a thermal barrier between the patient bore and each of the gradient coil assembly and RF body coil assembly to maintain the temperature within the patient bore below a maximum operating temperature. This allows the RF body coils to run cooler and also provide a barrier to the gradient coils.

In one preferred embodiment, a hollow conductor structure is introduced to the RF body coils at a position between the gradient coils and the patient bore tube. Cooling water, or other coolant, introduced through the hollow conductor structure captures heat generated from the gradient coils and RF body coils during MRI scans, therein preventing the heat from entering the patient bore.

In another preferred embodiment, the hollow conductor structure replaces the flat copper strip of the prior art and itself functions as the RF body coils. Again, as in the other preferred embodiment, cooling water introduced through the hollow conductor structure captures heat generated from the gradient coils and RF body coils during MRI scans, therein preventing the heat from entering the patient bore.

The present invention thus allows the RF body coils to run cooler and provide a thermal barrier to the heat emitted by the gradient coil during MRI scans. Therefore, the patient bore of the system will be cooler during the scans. This in turn allows the scans to be longer without adversely affecting the patient. Another potential benefit is that the hollow conductor will provide a stiffer RF body coil, which may reduce acoustical noise generated during scanning operations.

Other objects and advantages of the present invention will become apparent upon the following detailed description and appended claims, and upon reference to the accompanying drawings.

DETAILED DESCRIPTION

In the following description, various operating parameters and components are described for one constructed embodiment. These specific parameters and components are included as examples and are not meant to be limiting.

Also in the following description, a MRI system component may include any one of the following: a superconducting magnet, a superconducting magnet support structure, a gradient magnet assembly, or any other MRI system component known in the art.

Figure 1:
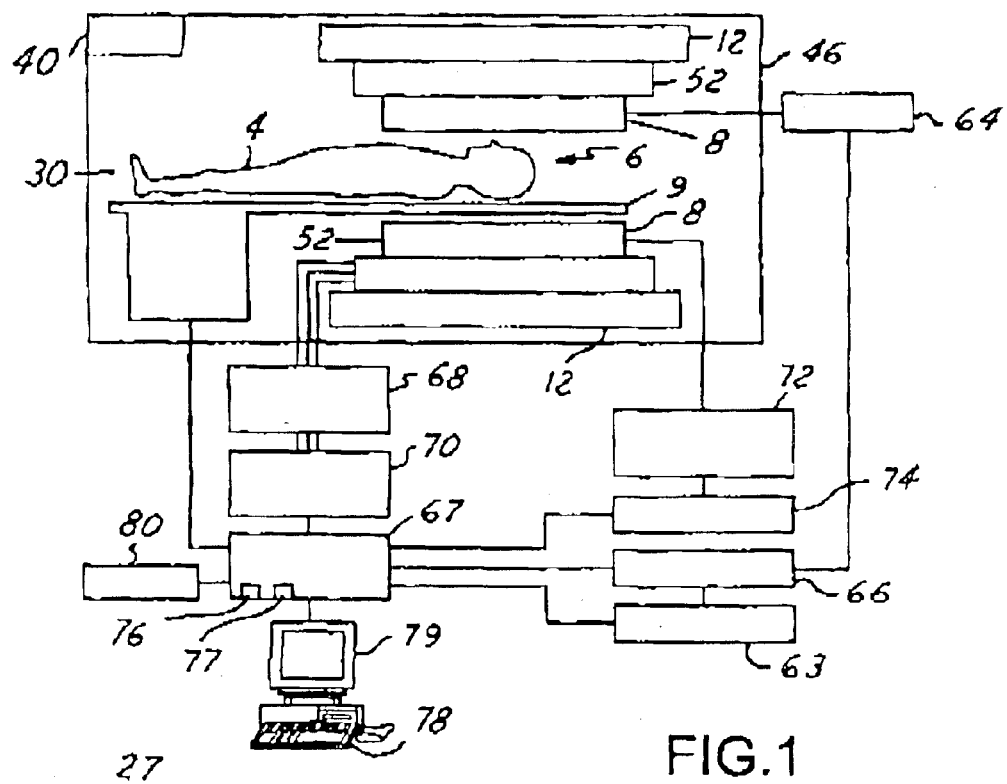
FIG. 1 is block diagram of a magnetic resonance imaging system.

Referring now to FIG. 1, a block diagrammatic view of a MRI system 2 is shown. The system includes a substantially cylindrical member that defines a scanning bore 6 for scanning a patient 4 lying on a table 9. The scanning bore 6 includes a RF body coil assembly 8 mounted therein. Two section views of an RF body coil assembly a according to the prior art are described below in FIGS. 2 and 3.

The MRI system further includes a static magnet structure 12 including a shielded superconducting magnet having a plurality of superconducting magnetic field coils which generate a temporally constant magnetic field along a longitudinal z-axis of a scanning bore 6. The superconducting magnet coils are typically supported by a coil support structure and received in a cryostat.

The cryostat 46 includes the cylindrical member that defines the scanning bore 6 and extends parallel to the longitudinal axis. On a first exterior side of the cylindrical member, which is longitudinal side farthest away from the center 30 of the scanning bore 6, is a primary magnetic gradient coil assembly 52 having a plurality of gradient coils. Located on a second exterior side of the primary magnetic gradient coil assembly 52 is a cylindrical dielectric former. A RF (radio frequency) shield is applied to the cylindrical dielectric former.

A computer 56 controls all components of the MRI system 2. The RF components under the control of the computer 56 are the radio frequency source 63 and pulse programmer 66. The source 33 produces a sine wave of the desired frequency. The pulse programmer 66 shapes the RF pulses into apodized sinc pulses. The RF amplifier 64 increases the pulses power from milliwatts to kilowatts to drive the RF coils contained within the RF body coil assembly 8. The computer 56 also controls the gradient pulse programmer 70 that sets the shape and amplitude of each of the three gradient fields. The gradient amplifier 68 increases the power of the gradient pulses to a level sufficient to drive the gradient coils contained within the gradient coil assembly 52.

The operator of the MRI system 2 gives input to the computer 56 through a control console 78. An imaging sequence is selected and customized from the console 78. The patient 4 is placed on the table 9 and positioned within the bore 6. The computer 56 also controls the movement of the table 9, which has a desired positioning accuracy (typically around 1 mm). The image is taken when the patient 4 is properly positioned, and the operator can see the images on the video display monitor 79 located on the console 78 or can make hard copies of the images on the film printer 80.

An image reconstruction apparatus, or digitizer 74, reconstructs the received magnetic resonance signals received by an RF detector 72 into an electronic image representation that is stored in an image memory 76 of the computer 56. An image reconstruction device, such as a video processor 77, converts stored electronic images into an appropriate format for display on a video monitor 79. The scanned image may also be printed from the computer 56 in film form 80.

Figure 2:
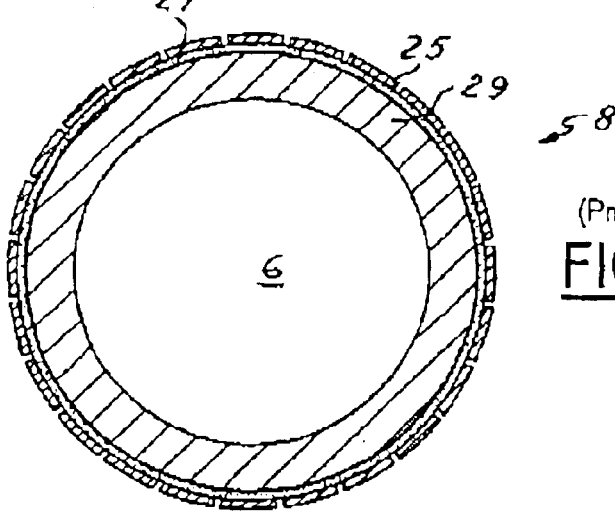
FIG. 2 is a partial section view of magnetic resonance imaging system having an RF body coil assembly according to one embodiment of the prior art.
Figure 3:
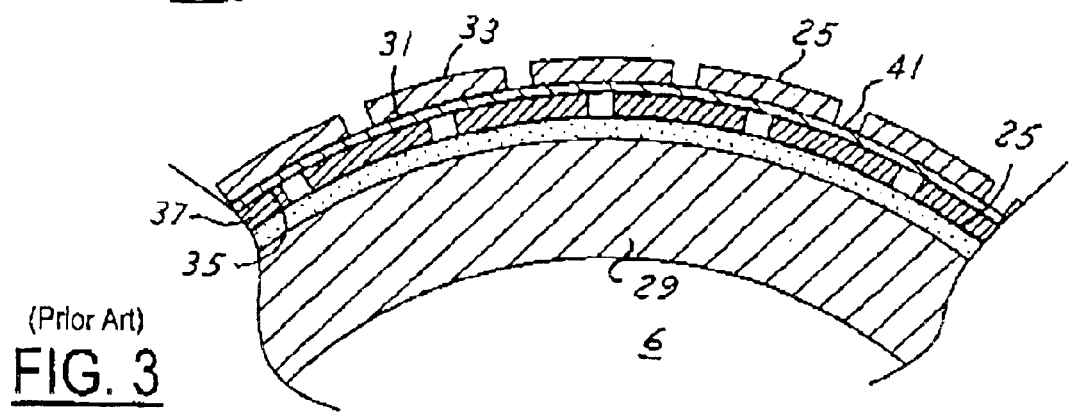
FIG. 3 is a partial section view of magnetic resonance imaging system having an RF body coil assembly according to another embodiment of the prior art.

FIGS. 2 and 3 illustrate two prior art embodiments of the RF body coil assembly 8. Referring now to FIG. 2, the RF body coil assembly 8 is shown having multiple (here shown as 24) rungs, or RF antennae (coils) 25, of etched copper glued or otherwise coupled to a composite backing 27. Each antenna 25 is typically less than about 0.5 mm in thickness. The composite backing 27 is glued to a carrier tube 29. The carrier tube is made of a composite material having a thickness of approximately 5 mm.

Alternatively, as shown in FIG. 3, the antennae 25 may be double layered, wherein a bottom surface 31 of the outer antennae 33 is coupled to a composite backing structure 41. The composite backing structure 41 is also coupled to the upper surface 35 of the inner antennae 37, which in turn is glued to the carrier tube 29. In this embodiment, the bottom surfaces 33 overlap about 50 percent of the upper surfaces 35 of each adjacent pair of inner antennae 37.

One problem with the RF antennae 25 of FIGS. 2 and 3 is that they tend to emit a small amount of heat during operation. In addition, the gradient coils of the gradient coil assembly 52 also emit heat during operation that radiates into the scanning bore 6, thereby raising the temperature of the scanning bore 6 as experienced by the patient 4. This causes limits to the length of the available duty cycles used in patient MRI scans.

The present invention addresses these concerns by providing a heat barrier between the patient bore 6 and each of the gradient coil assembly 12 and RF body coil assembly 8 to maintain the temperature within the patient bore 6 below a maximum operating temperature. This allows the RF body coils to run cooler. This also provides a thermal barrier between the gradient coils and the patient bore.

Figure 4:
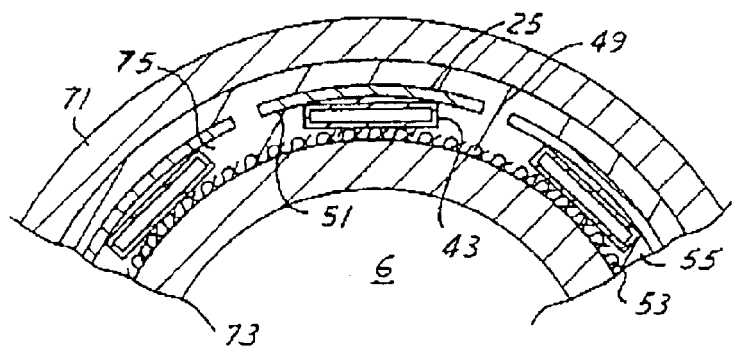
FIG. 4 is a partial section view of magnetic resonance imaging system having a water cooled RF body coil assembly according to one embodiment of the present invention.
Figure 5:
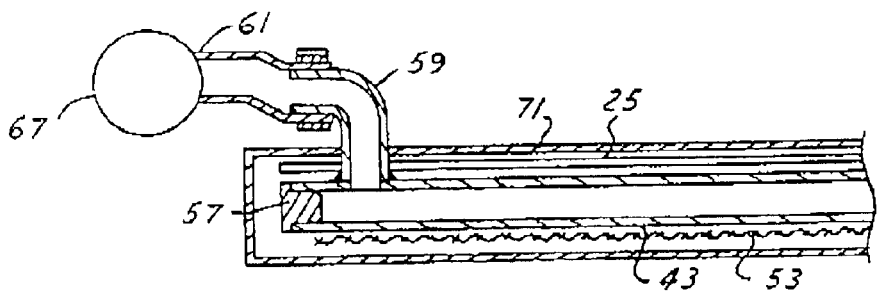
FIG. 5 is a side view of FIG. 4.

Two preferred embodiments of the present invention that can be integrated into mostly conventional MRI systems such as in FIG. 1 are described below in FIGS. 4–7. In FIGS. 4 and 5, lengths of hollow conductor structure are introduced within the region previously occupied by the carrier tube 29 near the RF antenna 25. These hollow structures are coupled at either end to a coolant source and drain. A non-conductive coolant is run through the hollow structure. The coolant removes the heat radiating from the RF coils and gradient coils during operation, thereby preventing the heat from entering the patient bore 6.

Figure 6:
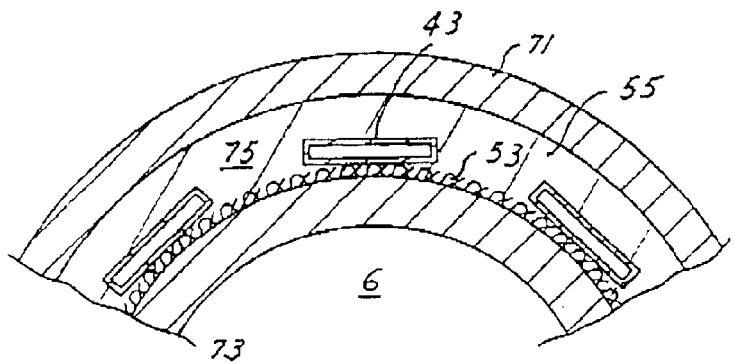
FIG. 6 is a partial section view of magnetic resonance imaging system having a water cooled RF body coil assembly according to another preferred embodiment of the present invention.
Figure 7:
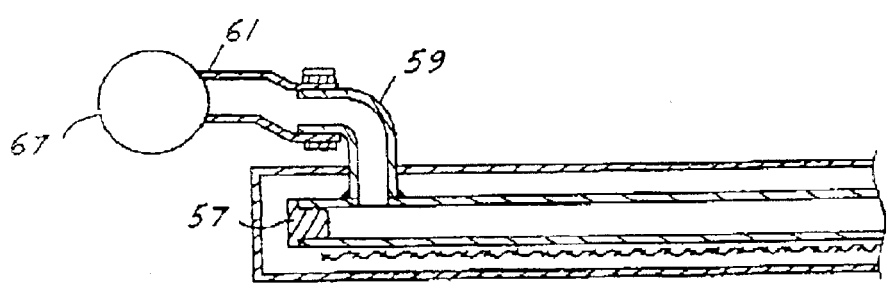
FIG. 7 is a side view of FIG. 6.

In FIGS. 6 and 7, the RF antennae are entirely replaced with a plurality of hollow conductive structures spaced circumferentially around the patient bore 6 that function as the RF antennae. A non-conductive coolant is run through the hollow structure. The coolant removes the heat radiating from the RF coils and gradient coils during operation, thereby preventing the heat from entering the patient bore 6.

Referring now to FIG. 4, a hollow conductive structure 43 is affixed to a bottom surface 51 of each of the plurality of RF antennae 25 within a composite material 55. Preferably, the hollow conductive structure 43 is formed of copper and is affixed to the respective copper RF antennae 25 by soldering. The hollow conductive structure preferably has a thickness of about 3–4 millimeters. The number and spacing of the RF antennae 25 are designed such that the gaps 49 between the respective RF antennae 25 to give acceptable performance. Thus, the number of RF antennae 25, and the size of the gaps 49, may be varied to give acceptable MRI scanning performance, as one of ordinary skill in the art can easily appreciate.

A glass cloth 53 is also introduced within the composite material 55 (i.e. the glass cloth is impregnated with the composite material 55) to impart additional reinforcement to the RF body coil assembly 8. Deionized water or other non-conductive cooling liquids are then introduced through the hollow structure 43 during MRI scans to provide cooling to the RF antennae 25 during use. This is necessary because the hollow structure 43 is in contact with the RF antennae 25.

In addition, the hollow conductive structure 43 will provide cooling of any radiant heat emitted from the overlying gradient coils contained within the gradient coil assembly 52 during usage. In this manner, the bore 6 can be maintained at a temperature below a maximum desired temperature during MRI scanning. This maximum temperature corresponds to a temperature that is comfortable to the patient during the entire MRI scan. Preferably, this maximum temperature is about 24 degrees Celsius.

As best seen in FIG. 5, at the ends of the RF body coil assembly 8, each of the ends of the hollow structures 43 are brazed to fittings, here shown as a copper stub pipe 59. The copper stub pipe 59 in turn is coupled to a non-conducting manifold, here a rubber manifold 61, that is plumbed in to a coolant source 67 to provide a single feed and return connection. Deionized water or other non-conductive cooling liquids introduced to the hollow conductive structure 43 from the coolant source 67 is maintained between about 15 and 24 degrees Celsius to ensure that the patient bore 6 is maintained below 24 degrees Celsius during the MRI scan.

Alternatively, as shown in FIGS. 6 and 7, the hollow conductive structure 43 is contained within a composite material 55 without the associated RF antennae 25. In this preferred embodiment, and due to the conductive nature of the structure 43, the structure 43 itself functions as the RF antennae.

Similar to the embodiment of FIGS. 4 and 5, a glass cloth 53 is also introduced within the composite material 55 (i.e. the glass cloth is impregnated with the composite material) to impart additional reinforcement to the RF body coil assembly 8. Deionized water or other non-conductive cooling liquids are then introduced through the hollow structure 43 during MRI scans to provide cooling to the copper portion of the hollow conductive structure 43 during use. In addition, the hollow structure 43 will provide cooling of any radiant heat emitted from the overlying gradient coils contained within the gradient coil assembly 52 during usage. In this manner, the bore 6 can be maintained at a temperature below about 24 degrees Celsius during MRI scanning, a temperature that is comfortable to the patient.

As best seen in FIG. 7, at the ends of the RF body coil assembly 8, the hollow structures 43 are brazed to fittings, here shown as a copper stub pipe 59. The hollow structures 43 are also plugged with a brazed copper plug 57. The copper stub pipe 59 in turn is coupled to a non-conducting manifold, here a rubber manifold 61, that is plumbed into a coolant source, here shown as a water source 67, to provide a single water feed and return connection. The water introduced to the hollow conductive structure 43 from the water source 67 is maintained between about 15 and 24 degrees Celsius to ensure that the patient bore 6 is maintained below 24 degrees Celsius during the MRI scan. In addition, the flow rate of water through the hollow conductor structures 43 may also be controlled to maintain the patient bore 6 below the maximum allowable temperature as desired.

To form the RF body coil assembly 8 of either embodiment described above, as best shown in FIGS. 4 and 6, the hollow structure 43 (with or without the optional RF antenna 25) and glass cloth 53 are then placed between a pair of steel mandrels 71, 73. The mandrels are then closed such that the structure 43 and glass cloth 53 are contained in a cavity 75 created between the mandrels 71, 73. A quantity of the composite material 55 is then infused under vacuum pressure within the cavity 75. The composite material 55 impregnates the glass cloth 55 and substantially fills the cavity 75 while avoiding cascading within the structure 43 and optional RF antennae 25. The composite material 55 hardens (cures) within the cavity. The mandrels 71, 73 are then removed, therein forming the RF body coil assembly 8. The composite material 55 has approximately the same thickness of the carrier tube 29 that it replaces. The body coil assembly 8 is then introduced to the MRI system 2 in a manner similar to how the RF antenna and carrier tubes 29 are typically introduced within the prior art.

The composite material 55 is preferably durable, hard, and somewhat thermally resistant non-conductive material that is easily introduced within the cavity as a liquid and subsequently cures to a hardened, supportive structure. One preferred composite material 55 is formed as the reaction product of a bisphenol A-type epoxy resin with an anhydride hardener. The reaction may be accelerated through use of an appropriate catalyst, or accelerator. A mineral oil plasticizer, or flexibilizer, is also typically introduced to toughen the cured compound and prevent crack propagation.

The composite material 55 is preferably introduced at low pressures (below 10 Torr) at a slow fill rate (taking about 4 hours to complete) to avoid "cascading" of the resin on the structure 43 or RF antennae 25. Cascading is characterized wherein the reaction product folds back on itself during the filling process, resulting in voids or low pressure air pockets. The reaction product cures at high temperatures, typically above 100 degrees Celsius.

The preferred embodiments of the present invention as described in FIGS. 4–7 offer substantial improvements over typical MRI systems of the prior art.

For example, the addition of the hollow conductor structure 43 will allow the RF coils to cooler than in the prior art. This allows MRI scans having higher duty cycles without the associated higher temperature readings within the bore 6, therein providing added patient comfort.

Also, the hollow conductor structure 43 will provide a thermal barrier to the heat emitted by the gradient coils during MRI scans. Again, this allows for higher duty cycles.

In addition, the hollow conductor 43 and composite material 55 will provide for a stiffer RF body coil assembly 8 than in the prior art. This in turn may reduce acoustical noise produced by the MRI device during MRI scans.

While two particular embodiments of the invention have been shown and described, numerous variations and alternative embodiments will occur to those skilled in the art. For example, control of the water temperature flowing through the hollow conductor structures, in terms of temperature and flow rate, may be controlled externally by a computer based control system. Alternatively, water temperature in combination with flow rate may be manually controlled by a human operator. Accordingly, it is intended that the invention be limited only in terms of the appended claims.

What is claimed is:

1. A magnetic resonance imaging system comprising:
   a patient bore;
   a gradient coil assembly surrounding said patient bore; an
   an RF body coil assembly coupled between said patient bore and said gradient coil assembly, said RF body coil assembly comprising at least one hollow conductor structure fluidically coupled to a coolant source having a non-conductive coolant, said non-conductive coolant flowing through said at least one hollow conductor structure to maintain said patient bore below a maximum desired temperature during operation of the magnetic resonance imaging system;
   a copper stub pipe fluidically coupled to each of said plurality of hollow conductor structures; and
   non-conducting manifold fluidically coupled between said copper stub pipe and said coolant source.

2. The magnetic resonance imaging system of claim 1, wherein said RF body coil assembly comprises:
   a plurality of RF antennae spaced circumferentially around said patient bore;
   a composite material;
   a plurality of hollow conductor structures contained within said composite material, one of said plurality of hollow conductor structures coupled to a respective one of said plurality of RF antennae; and
   a coolant source fluidically coupled with each of said plurality of hollow conductor structures, said coolant source capable of providing a non-conductive coolant through each of said plurality of hollow conductor structures.

3. The magnetic resonance imaging system of claim 2 further comprising a glass cloth introduced within said composite material.

4. The magnetic resonance imaging system of claim 2, wherein said composite material is formed from the reaction of a bisphenol A-type epoxy resin with an anhydride hardener.

5. The magnetic resonance imaging system of claim 2, wherein said coolant source comprises a water source.

6. The magnetic resonance imaging system of claim 5, wherein said non-conductive coolant comprises deionized water.

7. The magnetic resonance imaging system of claim 1, wherein one of said plurality of hollow conductor structures comprises a hollow copper structure.

8. The magnetic resonance imaging system of claim 1, wherein said maximum desired temperature is about 24 degrees Celsius.

9. The magnetic resonance imaging system of claim 1, wherein said RF body coil assembly comprises:
   a composite material;
   a plurality of hollow radiofrequency coils contained within said composite material; and
   a coolant source fluidically coupled with each of said plurality of hollow radiofrequency coils, said coolant source capable of providing coolant through each of said plurality of hollow radiofrequency coils.

10. A method for forming magnetic resonance imaging machine having a temperature-controlled patient bore, the method comprising:
    providing a pair of mandrels;
    introducing a plurality of RF coils within a cavity regions between said pair of mandrels, each of said plurality of RF coils being coupled to a hollow conductor structure;
    introducing a quantity of uncured composite material under vacuum pressure to said cavity;
    curing said uncured composite material;
    removing said mandrels to form a coolant-cooled body coil assembly;
    introducing said coolant-cooled RF body coil assembly within the magnetic resonance imaging machine between a gradient coil assembly and the patient bore;
    fluidically coupling said coolant-cooled RF body coil to a coolant source; and
    introducing a quantity of coolant from said coolant source through said coolant-cooled RF body coil during a scanning procedure, said quantity of coolant therein maintaining the temperature within the patient bore below a desired maximum temperature.

11. The method of claim 10, wherein said desired maximum temperature is below about 24 degrees Celsius.

12. The method of claim 11, wherein said quantity of coolant comprises a quantity of water.

13. The method of claim 10, further comprising introducing a glass cloth within said cavity prior to introducing said quantity of uncured composite material to said cavity.

14. The method of claim 10, wherein introducing a quantity of uncured composite material and curing said uncured composite material comprises:
    slowly introducing a first quantity of a bisphenol A type epoxy and a second quantity of an anhydride hardener under vacuum pressure to said cavity;
    reacting said first quantity with said second quantity to form a cured composite material.

15. A magnetic resonance imaging system comprising:
    a patient bore;
    a gradient coil assembly surrounding said patient bore;
    an RF body coil assembly coupled between said patient bore and said gradient coil assembly, said RF body coil assembly comprising:
    a plurality of RF antennae spaced circumferentially around said patient bore;
    a composite material;
    a glass cloth introduced within said composite material;
    a plurality of hollow conductor structures contained within said composite material, one of said plurality of hollow conductor structures coupled to a respective one of said plurality of RF antennae; and
    a coolant source fluidically coupled with each of said plurality of hollow conductor structures, said coolant source capable of providing a non-conductive coolant through each of said plurality of hollow conductor structures to maintain said patient bore below a maximum desired temperature during operation of the magnetic resonance imaging system.

16. The magnetic resonance imaging system of claim 15, wherein one of said plurality of hollow conductor structures comprises a hollow copper structure.

17. The magnetic resonance imaging system of claim 15 further comprising:
    a copper stub pipe fluidically coupled to each of said plurality of hollow conductor structures; and
    a non-conducting manifold fluidically coupled between said copper stub pipe and said coolant source.

18. A magnetic resonance imaging system comprising:
    a patient bore;
    a gradient coil assembly surrounding said patient bore;
    an RF body coil assembly coupled between said patient bore and said gradient coil assembly, said RF body coil assembly comprising:

a composite material;

a plurality of hollow radiofrequency coils contained within said composite material; and a coolant source fluidically coupled with each of said plurality of hollow radiofrequency coils, said coolant source capable of providing coolant through each of said plurality of hollow radiofrequency coils to maintain said patient bore below a maximum desired temperature during operation of the magnetic resonance imaging machine.

19. The magnetic resonance imaging system of claim 18, wherein one of said plurality of hollow radiofrequency coils comprises a hollow copper radiofrequency coil.

20. The magnetic resonance imaging system of claim 18, further comprising a glass cloth introduced within said composite material.

21. The magnetic resonance imaging system of claim 18 further comprising:

a copper stub pipe fluidically coupled to each of said plurality of hollow radiofrequency coils; and a non-conducting manifold fluidically coupled between said copper stub pipe and said coolant source.

22. The magnetic resonance imaging system of claim 18, wherein said coolant source comprises a water source.

23. The magnetic resonance imaging system of claim 22, wherein said non-conductive coolant comprises deionized water.

24. The magnetic resonance imaging system of claim 18, wherein said composite material is formed from the reaction of a bisphenol A-type epoxy resin with an anhydride hardener.

25. The magnetic resonance imaging system of claim 18, wherein one of said plurality of hollow conductor structures comprises a hollow copper structure.

26. The magnetic resonance imaging system of claim 18 further comprising:

a copper stub pipe fluidically coupled to each of said plurality of hollow conductor structures; and a non-conducting manifold fluidically coupled between said copper stub pipe and said coolant source.

27. The magnetic resonance imaging system of claim 18, wherein one of said plurality of hollow radiofrequency coils comprises a hollow copper radiofrequency coil.

28. The magnetic resonance imaging system of claim 18 further comprising a glass cloth introduced within said composite material.

29. The magnetic resonance imaging system of claim 18, wherein said composite material is formed from the reaction of a bisphenol A-type epoxy resin with an anhydride hardener.

30. A method for forming magnetic resonance imaging machine having a temperature-controlled patient bore, the method comprising:

providing a pair of mandrels;

introducing a plurality of hollow RF coils within a cavity regions between said pair of mandrels;

introducing a quantity of uncured composite material under vacuum pressure to said cavity;

curing said uncured composite material; and removing said mandrels to form a coolant-cooled RF body coil assembly;

introducing said coolant-cooled RF body coil assembly within the magnetic resonance imaging machine between a gradient coil assembly and the patient bore;

fluidically coupling said coolant-cooled RF body coil to a coolant source; and introducing a quantity of coolant from said coolant source through said coolant-cooled RF body coil during a scanning procedure, said quantity of coolant therein maintaining the temperature within the patient bore below a desired maximum temperature.

31. The method of claim 30, further comprising introducing a glass cloth within said cavity prior to introducing said quantity of uncured composite material to said cavity.

32. The method of claim 30, wherein introducing a quantity of uncured composite material and curing said uncured composite material comprises:

slowly introducing a first quantity of a bisphenol A type epoxy and a second quantity of an anhydride hardener under vacuum pressure to said cavity;

reacting said first quantity with said second quantity to form a cured composite material.

* * * * *